United States Patent
Linz et al.

(10) Patent No.: US 7,667,457 B2
(45) Date of Patent: Feb. 23, 2010

(54) SYSTEM AND APPARATUS FOR DETECTING GAMMA RAYS IN A PET/MRI SCANNER

(75) Inventors: Anton M. Linz, Mukwonago, WI (US);
Chang L. Kim, Waukesha, WI (US);
Jim L. Malaney, Pewaukee, WI (US);
David L. McDaniel, Dousman, WI (US);
Robert S. Stormont, Hartland, WI (US);
Ricardo Becerra, Waukesha, WI (US)

(73) Assignee: General Electric Co., Schenectady, NY (US)

( * ) Notice: Subject to any disclaimer, the term of this patent is extended or adjusted under 35 U.S.C. 154(b) by 308 days.

(21) Appl. No.: 11/615,324

(22) Filed: Dec. 22, 2006

(65) Prior Publication Data

US 2008/0265887 A1 Oct. 30, 2008

(51) Int. Cl.
*G01V 3/00* (2006.01)
(52) U.S. Cl. .................... 324/307; 324/318
(58) Field of Classification Search ............. 324/318, 324/300–322; 600/407–445; 250/363.03, 250/363.04
See application file for complete search history.

(56) References Cited

U.S. PATENT DOCUMENTS

| 4,939,464 | A | 7/1990 | Hammer | |
|---|---|---|---|---|
| 6,927,406 | B2 | 8/2005 | Zyromski | |
| 6,946,841 | B2 | 9/2005 | Rubashov | |
| 7,218,112 | B2 * | 5/2007 | Ladebeck et al. | 324/318 |
| 7,453,076 | B2 * | 11/2008 | Welch et al. | 250/492.3 |
| 2005/0113667 | A1 | 5/2005 | Schlyer et al. | |
| 2006/0052685 | A1 | 3/2006 | Cho et al. | |
| 2006/0250133 | A1 | 11/2006 | Krieg et al. | |
| 2006/0251312 | A1 | 11/2006 | Krieg et al. | |
| 2006/0293580 | A1 | 12/2006 | Ladebeck et al. | |
| 2007/0102641 | A1 | 5/2007 | Schmand et al. | |
| 2008/0146914 | A1 * | 6/2008 | Polzin et al. | 600/420 |
| 2008/0214927 | A1 * | 9/2008 | Cherry et al. | 600/411 |
| 2008/0284428 | A1 * | 11/2008 | Fiedler et al. | 324/307 |
| 2009/0043189 | A1 * | 2/2009 | Ladebeck et al. | 600/411 |

FOREIGN PATENT DOCUMENTS

WO 2006071922 A2 7/2006

OTHER PUBLICATIONS

Shao, et al., Simultaneous PET and MR Imaging, Phys. Med. Biol. 42 (1997) 1965-1970.

(Continued)

*Primary Examiner*—Brij B Shrivastav

(57) ABSTRACT

A gamma ray detector ring for a combined positron emission tomography (PET) and magnetic resonance imaging (MRI) system is integrated into a radio frequency (RF) coil assembly such that the detector ring is integrated with a RF shield. Each gamma ray detector in the detector ring includes a scintillator component that emits light when a gamma ray is detected and a photodetector component designed to be sensitive to the frequency of light produced by the scintillator. A RF shield may be integrated into a detector ring such that the RF shield is positioned between the scintillator and photodetector components of each detector, thereby saving valuable radial space within the imaging system. Multiple such detector rings may be located adjacent to one another to increase axial coverage and enable three-dimensional PET imaging techniques.

15 Claims, 8 Drawing Sheets

OTHER PUBLICATIONS

Pichler, PhD; et al., Performance Test of an LSO-APD Detector in a 7-T MRI Scanner for Simultaneous PET/MRI, The Journal of Nuclear Medicine, vol. 47, No. 4, Apr. 2006.

Frahani, PhD; et al., Contemporaneous Positron Emission Tomography and MR Imaging at 1.5 T, Journal of Magnetic Resonance Imaging 9:497-500 (1999).

Slates, et al., A Study of Artefacts in Simultaneous PET and MR Imaging Using a Prototype MR Compatible PET Scanner, Phys. Med. Biol. 44 (1999) 2015-2027.

Marsden, et al., Simultaneous PET and NMR, The British Journal of Radiology 75 (2002), S53-S59.

Peng, et al., Placing a PET Insert in the Bore of a 7T Magnet: Initial Study of the Interactions of the MRI System with the PET Shielding, Proc. Intl. Soc. Mag. Reson. Med. 14 (2006), 1358.

Schwaiger, M.D.; et al., MR-PET: Combining Function, Anatomy, and More, Special Molecular Imaging, Sep. 2005.

Jamali, et al., Magnetic Field Inhomogeneities Induced by PET Detector Scintillators in Dual Modality MRI/PET Systems, Proc. Intl. Soc. Mag. Reson. Med. 14 (2006), 1360.

Gilbert, et al., Magnet Design and Construction for a Field-Cycled MRI/PET System, Proc. Intl. Soc. Mag. Reson. Med. 14 (2006), 1357.

Garlick, et al., PET and NMR Dual Acquisition (PANDA): Applications to Isolated, Perfused Rat Hearts, NMR in Biomedicine, vol. 10 (1997), 138-142.

Peng, et al., Evaluation of Mesh Photomultiplier Tube Operation for Dual Modality PET/MRI Systems, Proc. Intl. Soc. Mag. Reson. Med. 14 (2006), 1359.

Handler, et al., Constraints Imposed on MRI in a Mixed Modality PET/MRI System, Proc. Intl. Soc. Mag. Reson. Med. 14 (2006), 1361.

Garlick, Simultaneous PET and NMR—Initial Results from Isolated Perfused Rat Hearts, The British Journal of Radiology, 75 (2002), S60-S66.

* cited by examiner

SYSTEM AND APPARATUS FOR DETECTING GAMMA RAYS IN A PET/MRI SCANNER

TECHNICAL FIELD

The present invention relates generally to positron emission tomography (PET) and magnetic resonance imaging (MRI), and more specifically, to a system and apparatus for detecting gamma rays in a combined PET/MRI scanner.

BACKGROUND

PET imaging involves the creation of tomographic images of positron emitting radionuclides in a subject of interest. A radionuclide-labeled pharmaceutical, i.e., a radiopharmaceutical, is administered to an imaging subject. The subject is positioned within a PET imaging system which includes a detector ring and detection electronics. As the radionuclides decay, positively charged photons known as "positrons" are emitted. For commonly used radiopharmaceuticals such as FDG, (i.e., $^{18}$F-fluorodeoxyglucose), these positrons travel only a few millimeters through the tissues of the subject before colliding with an electron, resulting in mutual annihilation. The positron/electron annihilation results in a pair of oppositely-directed gamma rays that are emitted with approximately 511 keV energy.

It is these gamma rays that are detected by the scintillator components of the detector ring. When struck by a gamma ray, the scintillating material in these components emits light, which is detected by a photodetector component, such as a photodiode or photomultiplier tube. The signals from the photodetectors are processed as incidences of gamma rays. When two gamma rays strike oppositely positioned scintillators at approximately the same time, a coincidence is registered. Data sorting units process the coincidences to determine which are true coincidence events and sort out data representing dead times and single gamma ray detections. The coincidence events are binned and integrated to form frames of PET data which may be reconstructed as images depicting the distribution of the radionuclide-labeled pharmaceutical in the subject.

MRI is a medical imaging modality that can create pictures of the inside of a human body without using x-rays or other ionizing radiation. MRI uses a powerful magnet to create a strong, uniform, static magnetic field (i.e., the "main magnetic field"). When a human body, or part of a human body, is placed in the main magnetic field, the nuclear spins that are associated with the hydrogen nuclei in tissue water become polarized. This means that the magnetic moments that are associated with these spins become preferentially aligned along the direction of the main magnetic field, resulting in a small net tissue magnetization along that axis (the "z axis", by convention). An MRI system also comprises components called gradient coils that produce smaller amplitude, spatially varying magnetic fields when current is applied to them. Typically, gradient coils are designed to produce a magnetic field component that is aligned along the z axis and that varies linearly in amplitude with position along one of the x, y or z axes. The effect of a gradient coil is to create a small ramp on the magnetic field strength and concomitantly on the resonant frequency of the nuclear spins, along a single axis. Three gradient coils with orthogonal axes are used to "spatially encode" the MR signal by creating a signature resonance frequency at each location in the body. Radio frequency (RF) coils are used to create pulses of RF energy at or near the resonance frequency of the hydrogen nuclei. These coils are used to add energy to the nuclear spin system in a controlled fashion. As the nuclear spins then relax back to their rest energy state, they give up energy in the form of an RF signal. This signal is detected by the MRI system, and combined with multiple additional such signals may be used to reconstruct an MR image using a computer and known algorithms.

Combining PET and MRI in a single scanner presents difficult technical challenges. An MRI scanner is typically designed to have the gradient coils, RF coils, shielding and cooling systems packed as close together as possible. Prior combined systems have located the PET detector components outside of an RF shield and within the gradient coil and magnet space of the MR magnet assembly. For example, prior solutions have included splitting the gradient coil to make space for a ring of PET detectors, splitting the gradient coil and magnet to make space for a ring of PET detectors or within the gradient coil and magnet space, separating the crystal and detector electronics used in the PET detector with fiber optic cables. However, these arrangements can take up significant radial space. In addition, the PET and MRI systems must not interfere with one another electrically. Accordingly, it would be desirable to provide a solution for integrating a PET detector, for example a ring of PET detectors, into a MRI magnet assembly by integrating the PET detector with the RF hardware components of the magnet assembly.

BRIEF DESCRIPTION OF THE INVENTION

In accordance with an embodiment, an apparatus for detecting gamma rays in a PET/MRI system including a first gap between a gradient coil and a radio frequency (RF) shield and a second gap between the RF shield and a RF coil includes a photodetector component located in the first gap and a scintillator component located in the second gap. A portion of the RF shield is positioned between the photodetector component and the scintillator component.

A combined PET/MRI system includes a MRI assembly having a gradient coil assembly, a radio frequency shield disposed within the gradient coil assembly, a first gap between the gradient coil assembly and the radio frequency shield, a radio frequency coil disposed within the radio frequency coil, and a second gap between the radio frequency shield and the radio frequency coil. The combined PET/MRI system also includes a PET imaging assembly having a first detector ring comprising a plurality of gamma ray detectors, each gamma ray detector comprising a photodetector component located in the first gap and a scintillator component located in the second gap, wherein for each gamma ray detector a portion of the radio frequency shield is positioned between the photodetector component and the scintillator component.

BRIEF DESCRIPTION OF THE DRAWINGS

Embodiments are illustrated by way of example and not limitation in the accompanying drawings, in which like reference numerals indicate corresponding, analogous or similar elements, and in which.

DETAILED DESCRIPTION

In the following detailed description, numerous specific details are set forth in order to provide a thorough understanding of embodiments. However it will be understood by those of ordinary skill in the art that the embodiments may be practiced without these specific details. In other instances, well-known methods, procedures, components and circuits have not been described in detail so as not to obscure the embodiments.

A gamma ray detector (for example, in a ring of gamma ray detectors) for a PET/MRI system may be integrated into a RF coil assembly such that the gamma ray detector ring and the RF coil components share the same space. A RF coil assembly may include an inner RF coil component and an outer RF shield component. These components may be built on cylindrical formers and share a common axis with a space or gap between them. A gamma ray detector includes a scintillator component that emits light when a gamma ray is detected and a photodetector component designed to be sensitive to the frequency of light produced by the scintillator. A small separation may be created between the scintillator component and the photodetector component and a portion of the RF shield may be placed between the scintillator component and the photodetector component. Accordingly, the scintillator component may be located in the space between the RF shield and the RF coil.

Figure 1:
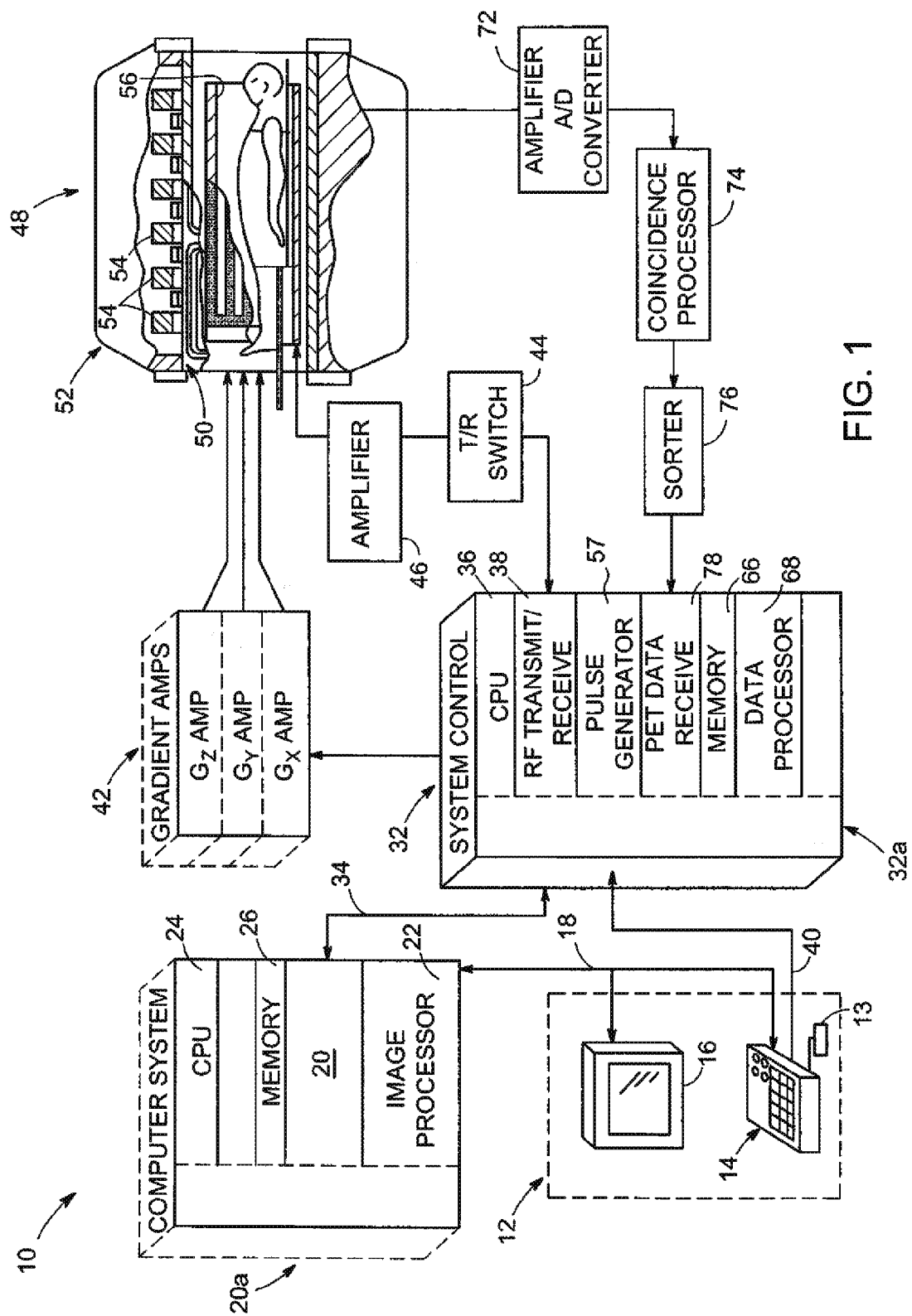
FIG. 1 is a schematic block diagram of a combined PET/MRI system in accordance with an embodiment.

Referring to FIG. 1, the main components of an exemplary combined PET/MRI system 10 that may incorporate embodiments of the present invention are shown. The operation of the system may be controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through electrical and/or data connections, for example, such as are provided by using a backplane 20a. Data connections may be direct wired links or may be fiber optic connections or wireless communications links or the like. The modules include an image processor module 22, a CPU module 24 and a memory module 26, which may include a frame buffer for storing image data arrays. In an alternative embodiment, the image processor module 22 may be replaced by image processing functionality on the CPU module 24. The computer system 20 may also be connected to permanent or back-up memory storage, a network, or may communicate with a separate system control 32 through a link 34. The input device 13 can include a mouse, joystick, keyboard, track ball, touch activated screen, light wand, voice control, or any similar or equivalent input device, and may be used for interactive geometry prescription.

The system control 32 includes a set of modules in communication with each other via electrical and/or data connections 32a. Data connections 32a may be direct wired links or may be fiber optic connections or wireless communication links or the like. System control 32 is connected to the operator console 12 through a communications link 40. It is through link 40 that the system control 32 receives commands from the operator to indicate the scan sequence or sequences that are to be performed. The modules of system control computer 32 include a CPU module 36 and a pulse generator module 57 that connects to the operator console 12 through a communications link 40. For MR data acquisition, an RF transmit/receive module 38 commands the scanner 48 to carry out the desired scan sequence, by sending instructions, commands, and/or requests describing the timing, strength and shape of the RF pulses and pulse sequences to be produced, to correspond to the timing and length of the data acquisition window. In this regard, a transmit/receive switch 44 controls the flow of data via amplifier 46 to scanner 48 from RF transmit module 38 and from scanner 48 to RF receive module 38. The system control 32 also connects to a set of gradient amplifiers 42 to indicate the timing and shape of the gradient pulses that are produced during the scan.

The gradient waveform instructions produced by system control 32 are sent to the gradient amplifier system 42 having Gx, Gy, and Gz amplifiers. Gradient amplifiers 42 may be external of scanner 48 or system control 32, or may be integrated therein. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which also includes a polarizing magnet 54 and an RF coil assembly 56. Alternatively, the gradient coils of gradient coil assembly 50 may be independent of magnet assembly 52. RF coil assembly 56 may include a whole-body RF transmit coil as shown, surface or parallel imaging coils (not shown), or a combination of both. The coils of the RF coil assembly 56 may be configured for both transmitting and receiving, or for transmit-only or receive-only. A pulse generator 57 may be integrated into system control 32 as shown or may be integrated into the scanner equipment 48 and produces pulse sequences or pulse sequence signals for the gradient amplifiers 42 and/or the RF coil assembly 56. Alternatively, RF coil assembly 56 may be replaced or augmented with surface and/or phased array receive coils. The MR signals resulting from the excitation pulses, emitted by the excited nuclei in the patient, may be sensed by the whole body coil or by separate receive coils, such as phased array coils or surface coils, and are then sent to the RF transmit/receive module 38 via T/R switch 44. The MR signals are demodulated, filtered, and digitized in the data processing section 68 of the system control 32.

An MRI scan is complete when one or more sets of raw k-space data has been acquired in the data processor 68. This raw k-space data is reconstructed in data processor 68 which operates to transform the data (through Fourier transformation or another technique) into image data. This image data is conveyed through the link 34 to the computer system 20 where it is stored in memory 26. Alternatively, in some systems, computer system 20 may assume the image reconstruction or other functions of data processor 68. In response to commands received from the operator console 12, the image data stored in memory 26 may be archived in long term storage or may be further processed by the image processor 22 and conveyed to the operator console 12 and presented on the display 16.

In the combined PET/MRI system 10, scanner 48 also contains a gamma ray detector or detectors (not shown) (e.g., a ring of gamma ray detectors) incorporated into the RF coil assembly as described below with respect to FIGS. 2-6. The gamma ray detector is configured to detect gamma rays from positron annihilations and may include a plurality of scintillators and photodetectors arranged circumferentially about a gantry (i.e., a ring of gamma ray detectors or a detector ring).

Gamma ray incidences are detected and transformed into electrical signals by the gamma ray detector. The electrical signals are conditioned by a series of front-end electronics 72. These conditioning circuits 72 may include various amplifiers, filters, and analog-to-digital converters. The digital signals output by the front end electronics 72 are then processed by a coincidence processor 74 to match gamma ray detections as potential coincidence events. When two gamma rays strike detectors approximately opposite one another, it is possible, absent the interactions of random noise and single gamma ray detections, that a positron annihilation took place somewhere along the line between the detectors. Thus, the coincidences determined by the coincidence processor 74 are sorted into true coincidence events and are ultimately integrated by a data sorter 76. The coincidence event data, or PET data, from the data sorter 76 is received by the system control 32 at a PET data receive port 78 and stored in memory 66 for subsequent processing by the processor 68. PET images may then be reconstructed by the image processor 22 and may be combined with MR images to produce hybrid structural and metabolic or functional images. The conditioning circuits 72, coincidence processor 74 and sorter 76 may each be external of the scanner 48 or the control system 32 or may be integrated therein.

Figure 2:
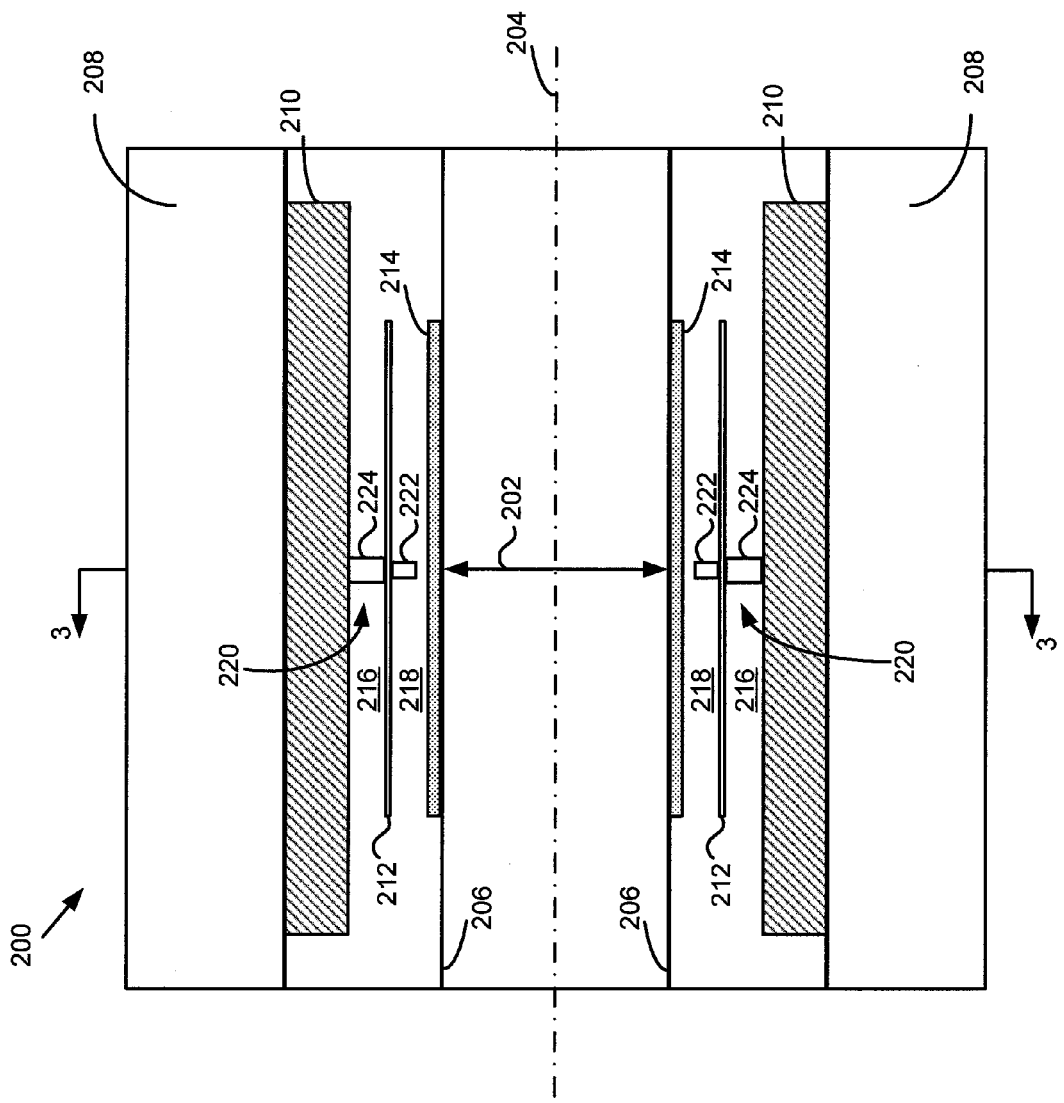
FIG. 2 is a schematic diagram of a cross-sectional side-elevation view of a magnet assembly in accordance with an exemplary embodiment.

FIG. 2 is a schematic diagram of a cross-sectional side-elevation view of a magnet assembly in accordance with an exemplary embodiment. Magnet assembly 200 may be used in a combined PET/MRI scanner (such as scanner 48 shown in FIG. 1). Magnet assembly 200 is cylindrical and annular in shape. The main components of the magnet assembly 200 are a superconducting magnet 208, a gradient coil assembly 210, a RF shield 212 and a RF coil 214. Various other elements, such as supports, suspension members, end caps, brackets, etc. are omitted from FIG. 2 for clarity. A cylindrical imaging volume 202 is surrounded by a patient bore tube 206. A patient or imaging subject (not shown) may be inserted into a magnet assembly 200 along a center axis 204 on a patient table or cradle (not shown). The center axis 204 is aligned along the tube axis of the magnet assembly 200 parallel to the direction of the $B_o$ magnetic field generated by a main, superconducting magnet 208. The RF coil 214 is used to apply a radio frequency magnetic field pulse to a patient or subject and to receive MRI information back from the subject, as is well known in the art of MR imaging. The RF shield 212 is used to shield the RF coil 214 from external sources of RF radiation. Gradient coil assembly 210 generates time dependent gradient magnetic field pulses in a known manner. The arrangement of the various cylinders in magnet assembly 200 may include annular spaces or gaps between the various elements. A first annular space or gap 216 is located between the gradient coil assembly 210 and the RF shield 212. A second annular space or gap 218 is located between the RF shield 212 and the RF coil 214. It should be understood that there may be other annular spaces or gaps between different cylindrical elements in magnet assembly 200, however, such spaces or gaps are not shown in FIG. 2 for clarity.

Figure 7:
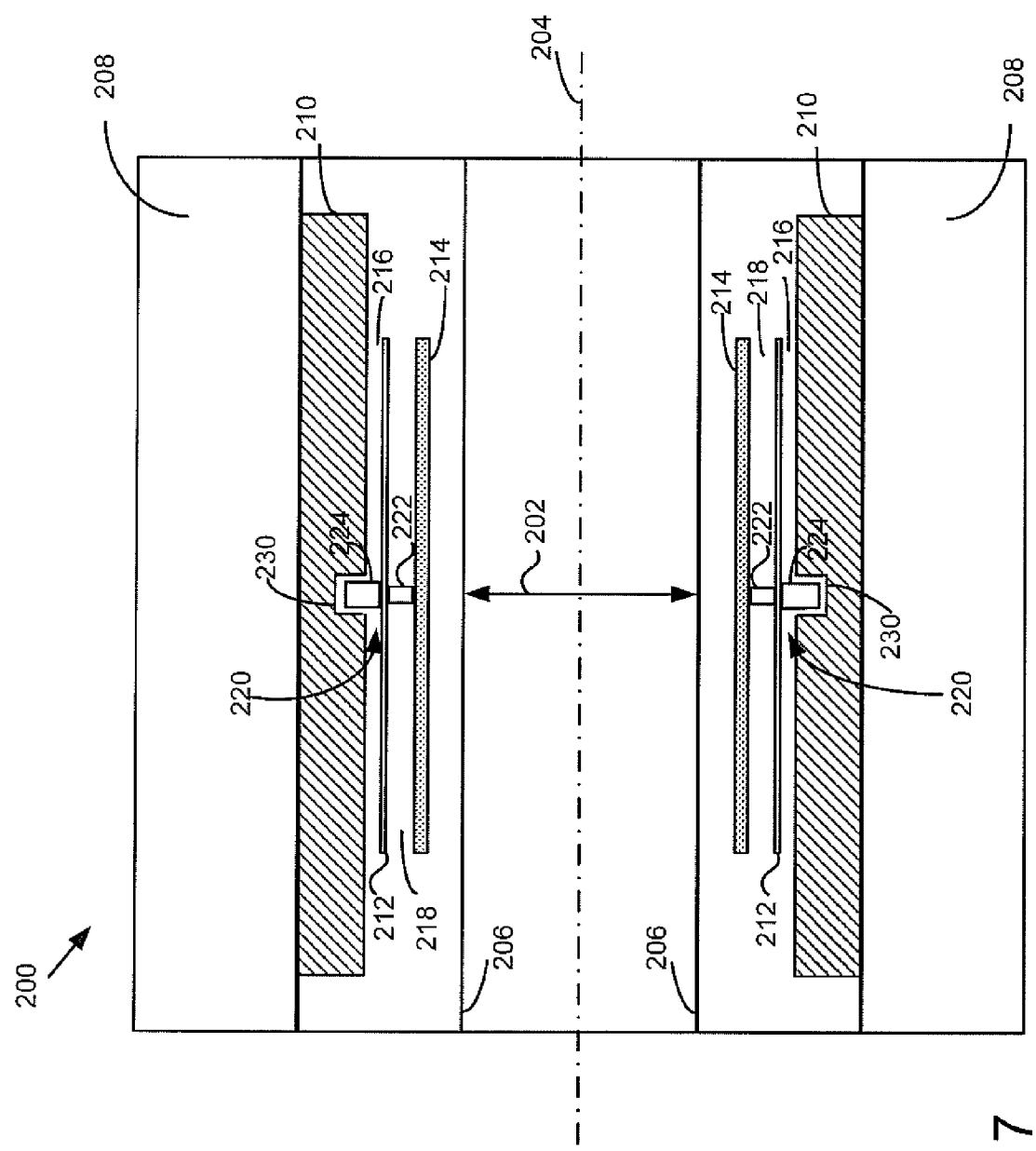
FIG. 7 is schematic diagram of a cross-section side-elevation view of a magnet assembly in accordance with an alternative embodiment.

A gamma ray detector 220 may be integrated into the magnet assembly using a scintillator component 222 separated from a photodetector component 224 by a space adequate to allow RF shield 212 to be positioned between the scintillator component 222 and the photodetector component 224. By separating the scintillator component 222 and the photodetector component 224, the scintillator component 222 may be located in the space 218 between the RF shield 212 and the RF coil 214. Accordingly, the radial spacing outside the RF shield 212 that is needed to accommodate a gamma ray detector 220 is reduced to the spacing necessary for the photodetector component 224. The photodetector component 224 may be located entirely within annular gap 216 along an inner surface of the gradient coil assembly 210 as shown. In an alternative embodiment, the gradient coils (not shown individually) comprising the gradient coil assembly 210 may be designed to leave conductor-free spaces 230 (e.g., a recess in the inner surface of the gradient coil assembly), as shown in FIG. 7, at the location of the gamma ray detectors 220 such that the photodetector component 224 may be partially or fully integrated into the gradient coil assembly 210, further reducing the radial spacing required for the gamma ray detector 220. RF shield 212 may be fabricated from any suitable conducting material, for example, sheet copper, circuit boards with conducting copper traces, copper mesh, etc.

Figure 3:
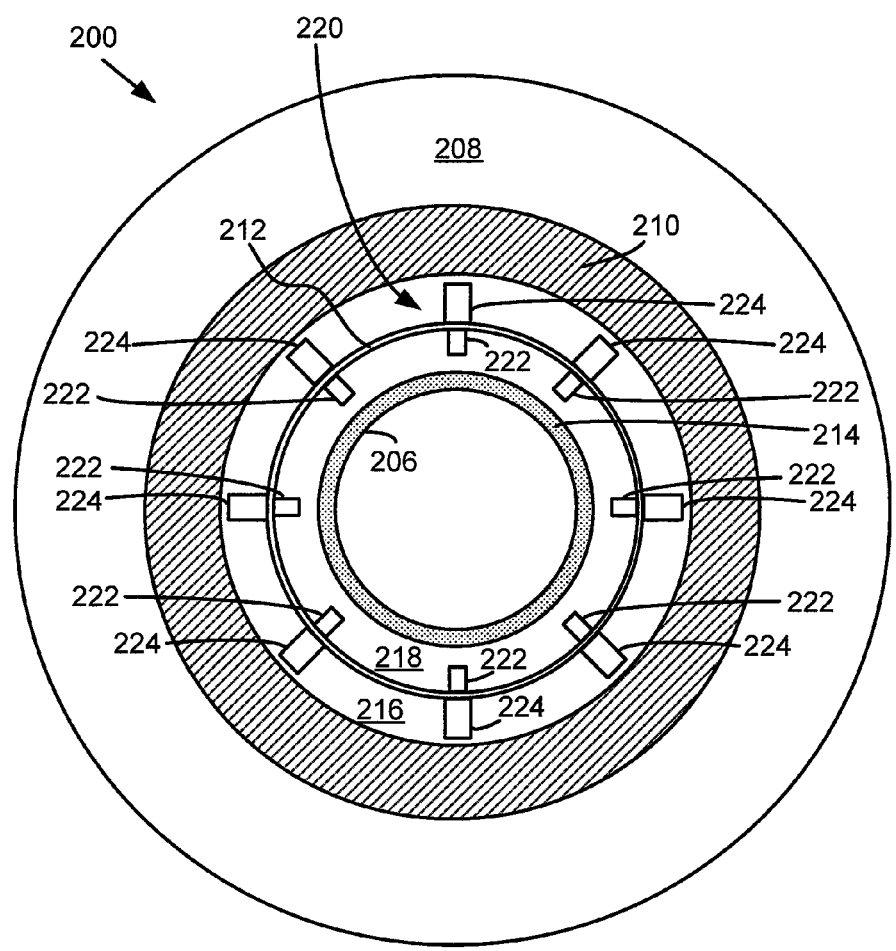
FIG. 3 is a schematic diagram of a cross-sectional view of the magnet assembly of FIG. 2 taken along line 3-3 of FIG. 2 in accordance with an embodiment.

FIG. 3 is a schematic diagram of a cross-sectional view of the main components of the magnet assembly of FIG. 2 taken along the line 3-3 of FIG. 2 in accordance with an embodiment. As mentioned with respect to FIG. 2, the main components of magnet assembly 200 are superconducting magnet 208, gradient coil assembly 210, RF coil 214 and RF shield 212. Various other elements, such as supports, suspension members, end caps, brackets, etc. are omitted from FIG. 3 for clarity. RF coil 214 is mounted on an outer surface of the patient bore tube 206 and mounted inside the gradient coil assembly 210. RF shield 212 is mounted inside the gradient coil assembly 210 and circumferentially surrounds RF coil 214. The gradient coil assembly 210 is disposed around RF shield 212 and RF coil 214 in a spaced apart coaxial relationship and gradient coil assembly 210 circumferentially surrounds the RF shield 212. The gradient coil assembly 210 is mounted inside the main superconducting magnet 208 and is circumferentially surrounded by magnet 208. As discussed above with respect to FIG. 2, magnet assembly 200 is cylindrical and annular in shape and the arrangement of the various cylindrical elements in magnet assembly 200 may include various annular spaces or gaps. A first annular space or gap 216 is located between the gradient coil assembly 210 and the RF shield 212. A second annular space or gap 218 is located between the RF shield 212 and the RF coil 214.

Figure 8:
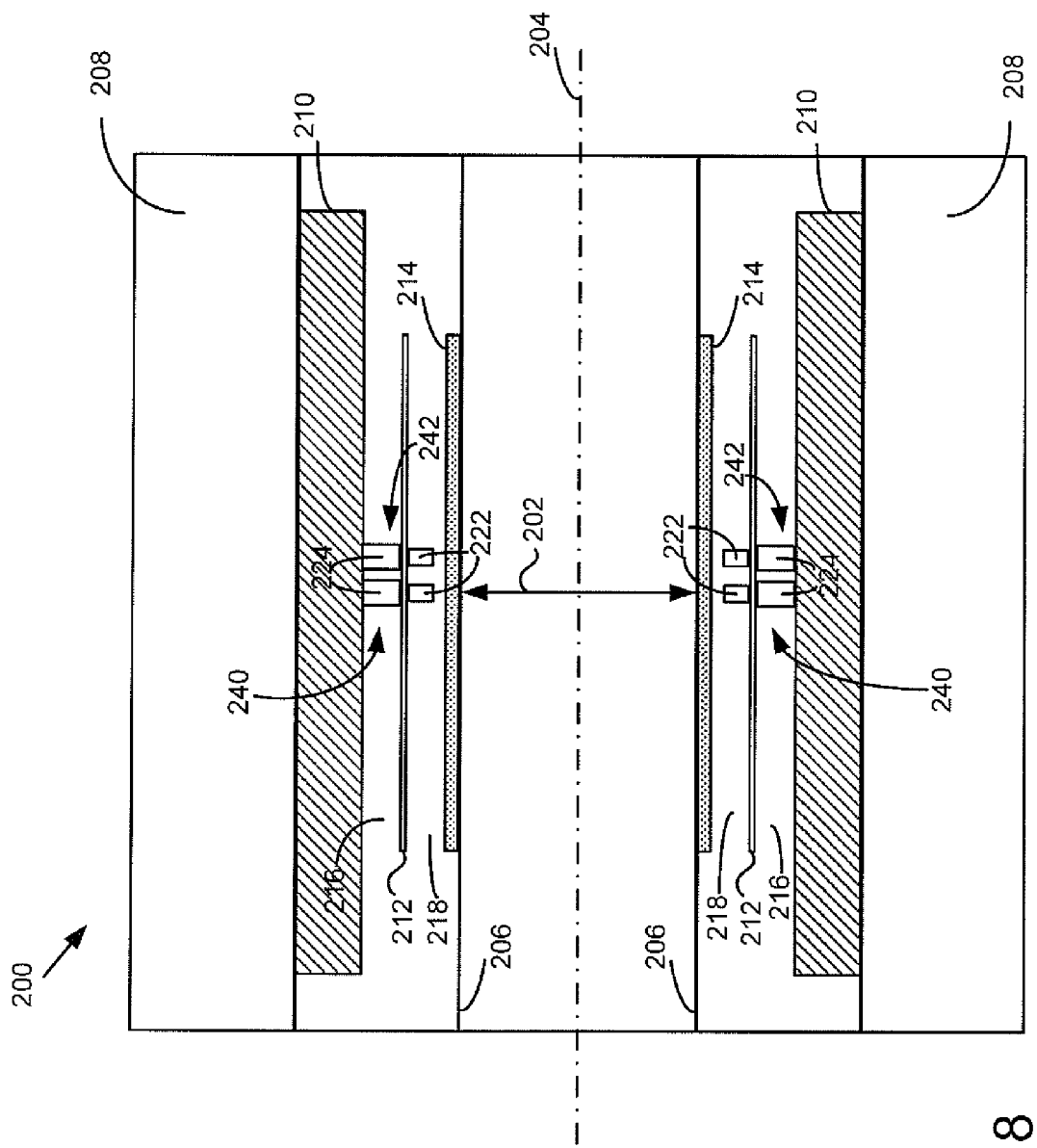
FIG. 8 is schematic diagram of a cross-section side-elevation view of a magnet assembly in accordance with an alternative embodiment.

In FIG. 3, multiple gamma ray detectors 220 are shown, each consisting of a scintillator component 222 and a photodetector component 224. The multiple gamma ray detectors 220 may be distributed circumferentially in a ring around RF shield 212 in a manner such that a portion of RF shield 212 is positioned between the scintillator component 222 and the photodetector component 224 of each gamma ray detector 220. Accordingly, for each gamma ray detector 220 in the detector ring, photodetector component 224 is positioned in the first annular gap 216 between the gradient coil assembly 210 and RF shield 212 and scintillator component 222 is positioned in the second annular gap 218 between RF shield 212 and RF coil 214. Eight gamma ray detectors 220 are shown in FIG. 3, however, a gamma ray detector ring for PET imaging may include any number of gamma ray detectors, for example, a typical gamma ray detector ring may include approximately 70 gamma ray detectors. Multiple adjacent gamma ray detector rings may be arranged in the magnet assembly as aligned circumferentially with the axis of the magnet assembly as a common axis to increase the axial imaging volume and/or to enable 3D image reconstruction techniques to be used. For example, FIG. 8 shows two adjacent gamma ray detectors 240, 242 position along the axis 204 of the magnet assembly 200. As mentioned above with respect to FIG. 3, each gamma ray detector ring 240, 242 includes multiple gamma ray detectors distributed circumferentially in a ring around RF shield 212.

Figure 4:
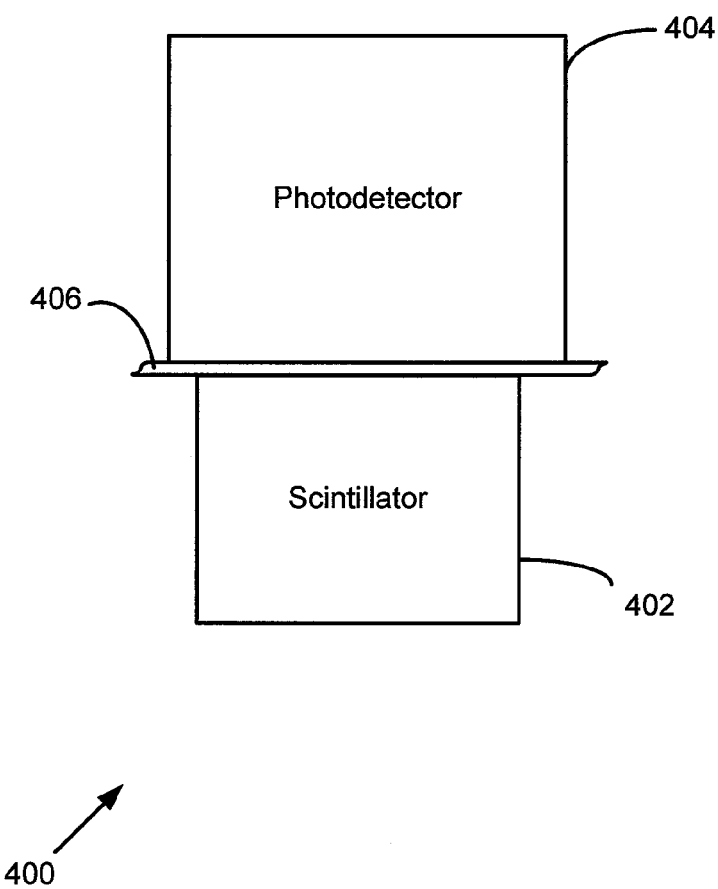
FIG. 4 is a schematic diagram of a side-elevation view of a single gamma ray detector, showing RF shield material between a scintillator component and a photodetector component in accordance with an embodiment.

FIG. 4 is a schematic diagram of a side-elevation view of a single gamma ray detector showing RF shield material between a scintillator component and a photodetector component in accordance with an embodiment. The scintillator component 402 of gamma ray detector 400 includes scintillator material that creates a burst of light when a gamma ray of appropriate energy is received. Scintillator materials that may be used include, for example, bismuth germinate (BGO), sodium iodide (NaI), gadolinium-oxyorthosilicate (GSO), lutetium-ortho-silictate (LSO) or other compounds with similar light-emitting properties. The photodetector component 404 detects the burst of light emitted from the scintillator component 402 and converts it into electrical currents that may be amplified by an amplifier (for example, an amplifier included in front end electronics 72, shown in FIG. 1). The photodetector component 404 may include silicon avalanche photodiodes or other light detection hardware. RF shield material 406 is located between the scintillator component 402 and the photodetector component 404. RF shield material may be a portion of a continuous RF shield, for example RF shield 212 (shown in FIG. 2 and FIG. 3). Alternatively, RF shield material 406 may be a different conducting material than is used to fabricate the remainder of the RF shield. For example, RF shield material 406 positioned between the scintillator component 402 and the photodetector component 404 may be fabricated from conducting mesh material while portions of the RF shield that are not positioned between components of a gamma ray detector 400 may be other forms of appropriate conducting material.

Figure 5:
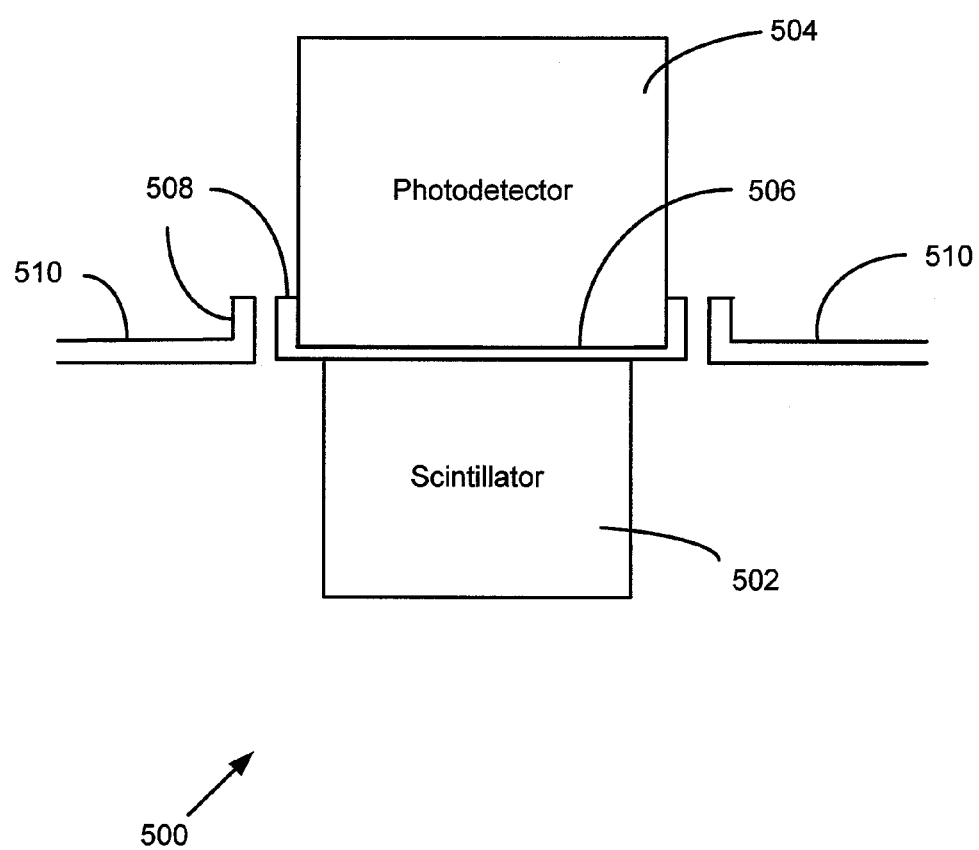
FIG. 5 is a schematic diagram of a side-elevation view of a gamma ray detector in accordance with an alternative embodiment.

In another embodiment, shown in FIG. 5, the RF shield material 506 may be integrated with the scintillator component 502 and the photodetector component 504 to form a single gamma ray detector unit 500. The gamma ray detector unit 500 may then be connected into an RF shield 510. The RF shield material 506 of the gamma ray detector unit 500 may be mechanically connected to the RF shield 510 or may be electrically connected or coupled to the RF shield 510 using a conductive interface 508. For example, a conductive collar or conducting flange may be added around the RF shield material 506 that may be mechanically or electrically connected to the RF shield 510. In another embodiment, multiple gamma ray detector units 500 may be connected side-by-side, with the conducting collars or flanges electrically connected or coupled to each other.

Figure 6:
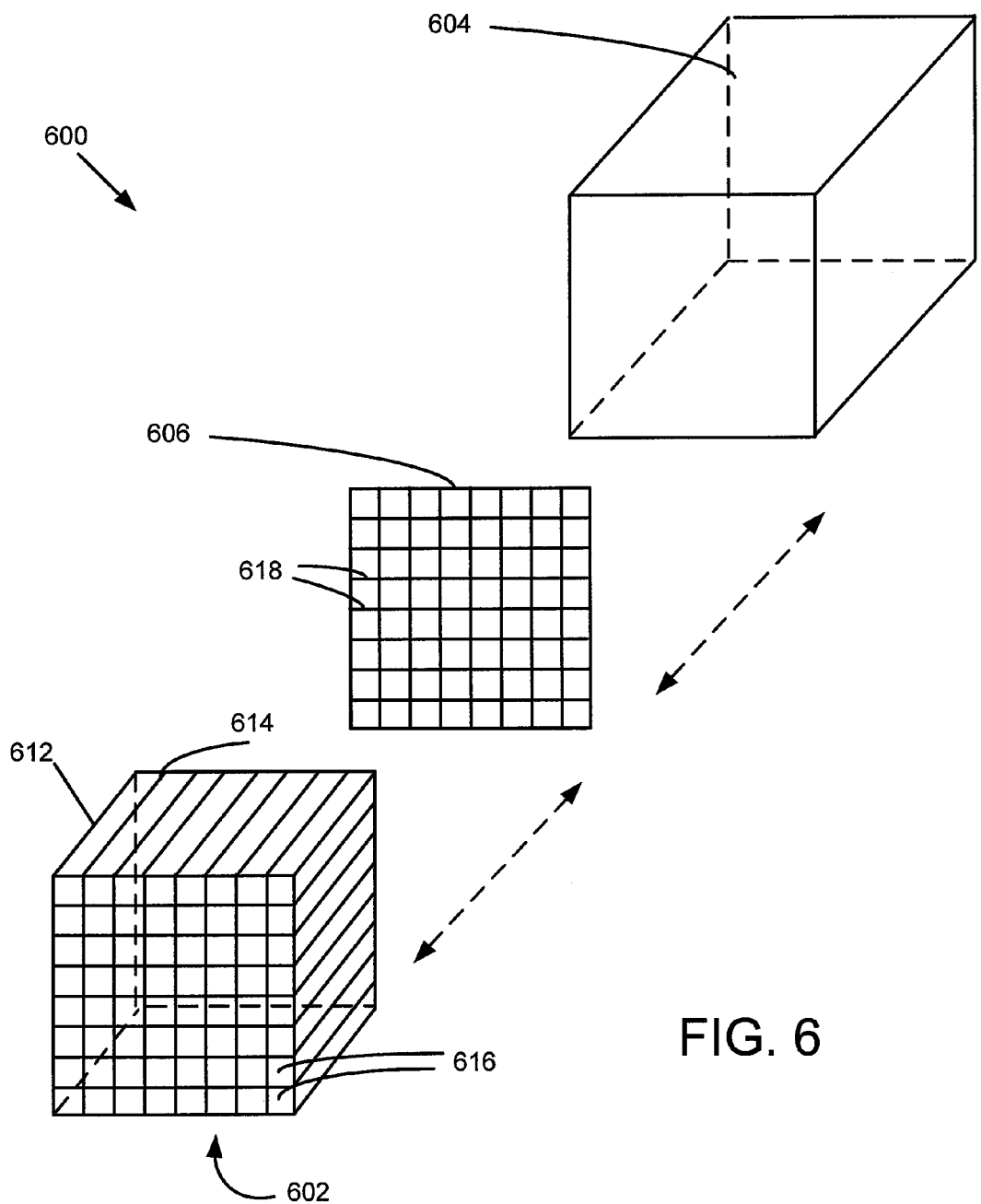
FIG. 6 is a schematic diagram of a perspective view of a gamma ray detector in accordance with an embodiment.

Returning to FIG. 4, as mentioned above, RF shield material 406 may be fabricated from a conducting wire mesh. FIG. 6 is a schematic diagram of a perspective view of a gamma ray detector using a conducting mesh for the RF shield material. The scintillator component 602 of the gamma ray detector 600 may include a BGO crystal block 612 that is made up of a matrix of sub-detector crystals 616, for example, an 8×8 matrix of sub-detectors crystals 616 may be used. The matrix of sub-detector crystals 616 may be designed such that "light guides" 614 direct the light into the photodetector component 604. RF shield material 606 may be a thin conducting mesh. The conducting mesh may be constructed from thin conducting wires 618 that may be arranged to align with the boundaries of the sub-detector crystals 616 in the crystal block 612 to avoid blocking the light emitted by the scintillator component 602 from reaching the corresponding photodetector component 604.

This written description uses examples to disclose the invention, including the best mode, and also to enable any person skilled in the art to make and use the invention. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. The order and sequence of any process or method steps may be varied or re-sequenced according to alternative embodiments.

Many other changes and modifications may be made to the present invention without departing from the spirit thereof. The scope of these and other changes will become apparent from the appended claims.

What is claimed is:

1. An apparatus for detecting gamma rays in a PET/MRI system including a first gap between a gradient coil and a radio frequency (RF) shield and a second gap between the RF shield and a RF coil, the apparatus comprising:
   a photodetector component located in the first gap; and
   a scintillator component located in the second gap;
   wherein a portion of the RF shield is positioned between the photodetector component and the scintillator component.

2. An apparatus according to claim 1, wherein the portion of the RF shield is in contact with the scintillator component.

3. An apparatus according to claim 1, wherein the portion of the RF shield is in contact with the photodetector component.

4. An apparatus according to claim 1, wherein the scintillator component comprises a scintillating crystal block.

5. An apparatus according to claim 4, wherein the scintillating crystal block comprises a plurality of sub-detector blocks separated by sub-detector boundaries.

6. An apparatus according to claim 5, wherein the portion of the RF shield comprises a plurality of wires that are aligned with and are located adjacent to the sub-detector boundaries.

7. An apparatus according to claim 1, wherein the portion of the RF shield comprises a conducting wire mesh.

8. An apparatus according to claim 1, wherein the photodetector component comprises at least one photomultiplier tube.

9. An apparatus according to claim 1, wherein the photodetector component comprises at least one photodiode.

10. A combined PET/MRI system comprising:
    a MRI assembly comprising
        a gradient coil assembly;
        a radio frequency shield disposed within the gradient coil assembly;
        a first gap between the gradient coil assembly and the radio frequency shield;
        a radio frequency coil disposed within the radio frequency shield; and
        a second gap between the radio frequency shield and the radio frequency coil; and
    a PET imaging assembly comprising
        a first detector ring comprising a plurality of gamma ray detectors, each gamma ray detector comprising a photodetector component located in the first gap and a scintillator component located in the second gap, wherein for each gamma ray detector a portion of the radio frequency shield is positioned between the photodetector component and the scintillator component.

11. A combined PET/MRI system according to claim 10, wherein the portion of the radio frequency shield positioned between a photodetector component and a scintillator component comprises a conducting wire mesh.

12. A combined PET/MRI system according to claim 10, wherein the scintillator component of each gamma ray detector comprises a scintillator crystal block comprising a plurality of sub-detector blocks separated by sub-detector boundaries and wherein the portion of the radio frequency shield positioned between the photodetector component and the scintillator component comprises a plurality of wires that are aligned with and located adjacent to the sub-detector boundaries.

13. A combined PET/MRI system according to claim 10, wherein the PET imaging assembly further comprises a second detector ring distributed axially along a common axis with the first detector ring and located adjacent to the first detector ring.

14. A combined PET/MRI system according to claim 10, wherein the gradient coil assembly has an inner surface configured to include at least one recess.

15. A combined PET/MRI system according to claim 14, wherein the photodetector component of at least one gamma ray detector is positioned within the at least one recess.

* * * * *